United States Patent [19]
Sporer et al.

[11] Patent Number: 6,167,083
[45] Date of Patent: Dec. 26, 2000

[54] COMPUTER SYSTEM AND PROCESS FOR CAPTURE EDITING AND PLAYBACK OF MOTION VIDEO COMPRESSED USING INTERFRAME AND INTRAFRAME TECHNIQUES

[75] Inventors: Michael Sporer, Wellesley; Katherine H. Cornog, Newburyport, both of Mass.; Peter Zawojski, Merrimack, N.H.; James Hamilton, Redwood City, Calif.

[73] Assignee: Avid Technology, Inc., Tewksbury, Mass.

[21] Appl. No.: 08/832,987

[22] Filed: Apr. 4, 1997

[51] Int. Cl.$^7$ ........................................... H04B 1/66
[52] U.S. Cl. ..................... 375/240.01; 386/4; 386/111
[58] Field of Search ......................... 348/412, 413, 348/414, 415, 699, 700, 578, 416; 386/4, 5, 109, 110, 111, 6, 52, 64; 382/236, 309, 305; 345/328; 375/240, 240.01

[56] References Cited

U.S. PATENT DOCUMENTS

| | | | |
|---|---|---|---|
| 5,045,940 | 9/1991 | Peters et al. | 358/143 |
| 5,267,351 | 11/1993 | Reber et al. | 395/600 |
| 5,315,326 | 5/1994 | Sugiyama | 348/415 |
| 5,459,517 | 10/1995 | Kunitake et al. | 348/700 |
| 5,495,291 | 2/1996 | Adams | 348/390 |
| 5,526,132 | 6/1996 | Tsubota et al. | 358/335 |
| 5,559,562 | 9/1996 | Ferster | 348/584 |
| 5,559,641 | 9/1996 | Kajimoto et al. | 360/14.1 |
| 5,577,190 | 11/1996 | Peters | 395/501 |
| 5,594,660 | 1/1997 | Sung et al. | 364/514 |
| 5,617,502 | 4/1997 | Ort et al. | 386/97 |
| 5,623,308 | 4/1997 | Civanlar et al. | 348/392 |
| 5,642,174 | 6/1997 | Kazui et al. | 348/699 |
| 5,646,931 | 7/1997 | Terasaki | 369/124 |
| 5,655,117 | 8/1997 | Goldberg et al. | 395/613 |
| 5,659,539 | 8/1997 | Porter et al. | 395/200.61 |
| 5,768,447 | 6/1998 | Irani et al. | 382/305 |
| 5,949,948 | 9/1999 | Krause et al. | 386/6 |
| 5,959,690 | 9/1999 | Toebes, VII et al. | 348/578 |

FOREIGN PATENT DOCUMENTS

| | | |
|---|---|---|
| 0 645 765 A1 | 3/1995 | European Pat. Off. .......... G11B 7/00 |
| 0 696 798 A1 | 2/1996 | European Pat. Off. . |
| 0 725 399 A2 | 8/1996 | European Pat. Off. . |
| WO 93/21636 | 10/1993 | WIPO . |
| WO 97/19552 | 5/1997 | WIPO . |

OTHER PUBLICATIONS

S. Merrill Weiss, "Switching Facilities in MPEG–2: Neccessary but not sufficient," Dec. 1995, SMPTE Journal, vol. 104, No. 12, pp. 788–802.

R. Hedtke, et al., "Schnittbearbeitung Von MPAG–2–Codierten Videosquenzen," Jul. 1996, Fernseh–Und Kino–Technik, vol. 50, No. 7, pp. 367–373.

Alpesh Saraiva, et al., "Encoding Solutions for MPEG Systems," Wescon '95 Conference Record, Nov. 1995, pp. 732–737.

Jiun Shiu, et al., "A Low–Cost Editor For MPEG–1 System Streams," Aug. 1995, IEEE Transactions on Consumer Electronics, vol. 41, No. 3, pp. 620–625.

P. Venkat Rangan, et al., "Continuity and Synchronization in MPEG," Jan. 1996, IEEE Journal on Selected Areas in Communications, vol. 14, No. 1, pp. 52–60.

*Primary Examiner*—Chris S. Kelley
*Assistant Examiner*—Gims Philippe
*Attorney, Agent, or Firm*—Wolf, Greenfield & Sacks, P.C.

[57] ABSTRACT

Random access to arbitrary fields of a video segment compressed using both interframe and intraframe techniques is enhanced by adding state information to the bitstream prior to each intraframe compressed image to allow each intraframe compressed image to be randomly accessed by generating a field index that maps each temporal field to the offset in the compressed bitstream of the data used to decode the field, and by playing back segments using two or more alternatingly used decoders. The cut density may be improved by eliminating from the bitstream applied to each decoder any data corresponding to bidirectionally compressed images that would otherwise be used by the decoder to generate fields prior to the desired field.

10 Claims, 9 Drawing Sheets

90- BITSTREAM ORDER OF MPEG PICTURES:

I0   P3   B1   B2   P6   B4   B5

92- NUMBER OF VIDEO FIELDS REPRESENTED BY EACH CODED PICTURE:

2   3   3   2   2   1   1

94- TEMPORAL FIELD #:

0  1  2  3  4  5  6  7  8  9  10  11  12  13

96- MPEG PICTURES:

I0  I0  B1  B1  B1  B2  B2  P3  P3  P3  B4  B5  P6  P6

97- FIELD INDEX: ENTRY NUMBER:

0  1  2  3  4  5  6  7  8  9  10  11  12  13

98- FIELD INDEX: OFFSET:

I0  I0  P3  P3  P3  B1  B1  B1  B2  B2  P6  P6  B4  B5

99- TEMPORAL OFFSET:

0  0  3  3  3  3  3  -5  -5  -5  2  2  -2  -2

Fig. 5

COMPUTER SYSTEM AND PROCESS FOR CAPTURE EDITING AND PLAYBACK OF MOTION VIDEO COMPRESSED USING INTERFRAME AND INTRAFRAME TECHNIQUES

FIELD OF THE INVENTION

The present invention is related to the capture, editing and playback of motion video and associated audio in digital form, wherein the motion video data is compressed using interframe and intraframe techniques.

MICROFICHE APPENDEX

The present application includes one microfiche appendix, labeled A0521/7093, which contains 20 data frames containing a computer code listing.

BACKGROUND OF THE INVENTION

Several systems are presently available for capture, editing and playback of motion video and associated audio. A particular category of such systems includes digital nonlinear video editors. Such systems store motion video data as digital data, representing a sequence of digital still images, in computer data files on a random access computer readable medium. A still image may represent a single frame, i.e., two fields, or a single field of motion video data. Such systems generally allow any particular image in the sequence of still images to be randomly accessed for editing and for playback. Digital nonlinear video editors have several benefits over previous video tape-based systems which provide only linear access to video information.

Since digital data representing motion video may consume large amounts of computer memory, particularly for full motion broadcast quality video (e.g., sixty field per second for NTSC and fifty fields per second for PAL), the digital data typically is compressed to reduce storage requirements. There are several kinds of compression for motion video information. One kind of compression is called "intraframe" compression which involves compressing the data representing each still image independently of other still images. Commonly-used intraframe compression techniques employ a transformation to the frequency domain from the spatial domain, for example, by using discrete cosine transforms. The resulting values typically are quantized and encoded. Commonly-used motion video compression schemes using intraframe compression include "motion-JPEG" and "I-frame only" MPEG. While intraframe compression reduces redundancy of data within a particular image, it does not reduce the significant redundancy of data between adjacent images in a motion video sequence. For intraframe compressed image sequences, however, each image in the sequence can be accessed individually and decompressed without reference to the other images. Accordingly, intraframe compression allows purely nonlinear access to any image in the sequence.

More compression can obtained for motion video sequences by using what is commonly called "interframe" compression. Interframe compression involves predicting one image using another. This kind of compression often is used in combination with intraframe compression. For example, a first image may be compressed using intraframe compression, and typically is called a key frame. The subsequent images may be compressed by generating predictive information that, when combined with other image data, results in the desired image. Intraframe compressed images may occur every so often throughout the sequence. Several standards use interframe compression techniques, such as MPEG-1(ISO/IEC 11172-1 through 5), MPEG-2 (ISO/IEC 13818- 1 through 9) and H.261, an International Telecommunications Union (ITU) standard. MPEG-2, for example, compresses some images using intraframe compression (called I-frames or key frames), and other images using interframe compression techniques for example by computing predictive errors between images. The predictive errors may be computed for forward prediction (called P-frames) or bidirectional prediction (called B-frames). MPEG-2 is designed to provide broadcast quality full motion video.

For interframe compressed image sequences, the interframe compressed images in the sequence can be accessed and decompressed only with reference to other images in the sequence. Accordingly, interframe compression does not allow purely nonlinear access to every image in the sequence, because an image may depend on either previous or following images in the sequence. Generally speaking, only the intraframe images in the sequence may be accessed nonlinearly. However, in some compression formats, such as MPEG-2, some state information needed for decoding or displaying an intraframe compressed image, such as a quantization table, also may occur elsewhere in the compressed bitstream, eliminating the ability to access even intraframe compressed images nonlinearly.

One approach to handling the playback of serially dependent segments in an arbitrary sequence is described in U.S. Pat. No. 4,729,044, (Keisel). In this system, the dependency between images in a segment is due to the linear nature of the storage media, i.e., video tape. Several tapes containing the same material are used. For any given segment to be played back, an algorithm is used to select one of the tapes from which the material should be accessed. At the same time, a tape for a subsequent segment is identified and cued to the start of the next segment. As a result, several identical sources are processed in parallel in order to produce the final program.

In nonlinear systems, the need for multiple copies of video sources to produce arbitrary sequences of segments has been avoided by the random-access nature of the media. Arbitrary sequences of segments from multiple data files are provided by pipelining and buffering nonlinear accesses to the motion video data. That is, while some data is being decompressed and played back, other data is being retrieved from a data file, such as shown in U.S. Pat. No. 5,045,940 (Peters et al.).

In such systems, video segments still may need to be processed in parallel in order to produce certain special effects, such as dissolves and fades between two segments. One system that performs such effects is described in PCT Publication No. WO 94/24815 (Kurtze et al.). In this system, two video streams are blended by a function $\alpha A+(1-\alpha)B$ wherein A and B are corresponding pixels in corresponding images of the two video streams. A common use of this system is to play segment A, and to cause a transition to segment B over several images. The data required for segment B is loaded into a buffer and decompressed while A is being played back so that decoded pixels for segment B are available at the time the transition is to occur. Similar systems also are shown in U.S. Pat. Nos. 5,495,291 (Adams) and 5,559,562 (Ferster). When using interframe compression, if a second segment starts with an interframe image, the processing of the second segment may have to begin earlier during processing of a previous first segment to allow the desired image of the second segment to be available. Ideally, the second segment should be processed from a previous intraframe compressed image. However, these preceding images are not used in the output.

A problem arises when a third segment of interframe and intraframe compressed video is to be played. In particular, the second segment must be long enough to allow the first image of the third segment to be completely processed from a previous intraframe compressed image. If only two channels of decoders are available, this processing for the third sequence would be performed using the same decoder used to process the first segment, after the first sequence is processed. In some cases, the first decoder also may output several images after the last desired image is output. The minimum size of any second segment is referred to as the cut density. While the cut density in principle can be reduced to a single field by using only intraframe compression, interframe compression provides better compression. Accordingly, it is desirable to minimize the cut density using interframe compression.

Another problem in designing a system that is compatible with some standards, such as MPEG-2, is that there are many options that may or may not be present in a coded bitstream. For example, an MPEG-2 formatted bitstream may include only I-frames, or I and P frames, or I, B and P frames. The order in which these frames is displayed also may be different from the order they are stored. Each compressed image also may result in the output of anywhere from zero to six fields. State information needed to decode any particular image, including an I-frame, may also occur at any point in the bitstream. As a result, the ability to randomly access a particular field in an arbitrary MPEG-2 compliant bitstream may be determined by the actual format of the bitstream.

Accordingly, a general aim of the present invention to provide a system which allows nonlinear editing of interframe and intraframe compressed motion video with a minimum cut density. Another general aim in one embodiment of the invention is to allow mixed editing of interframe and intraframe compressed data streams with different compression formats.

SUMMARY OF THE INVENTION

Random access to arbitrary fields of a video segment compressed using both interframe and intraframe techniques is enhanced by including state information, for decoding and display, at appropriate points in the compressed bitstream in order to enable random access to each intraframe compressed image to allow each intraframe compressed image to be randomly accessed. In addition, a field index is generated that maps each temporal field to the offset in the compressed bitstream of the data used to decode the field. Additional benefits are provided by playing back segments using two or more alternatingly used decoders. The cut density may be improved by eliminating from the bitstream applied to each decoder any data corresponding to bidirectionally compressed images that would otherwise be used by the decoder to generate fields prior to the desired field.

Accordingly, one aspect of the invention is computer system for editing motion video compressed using interframe and intraframe techniques. The computer system stores a compressed bitstream for each motion video source to be edited. Each compressed bitstream is processed to detect state information which is used to decode and/or display compressed data. The detected state information is added at appropriate points in the bitstream for each intraframe compressed image. The state information also may be properly inserted during compression. The computer system also processes the compressed bitstream to generate an index that maps each temporal field of a corresponding decompressed output image sequence to a first compressed image used to start decompressing the temporal field, and the offset in the bitstream of the data for the first compressed image. The index may be created while the motion video is captured or imported or by using a post-processing approach. The computer system provides an editing system that permits a user to specify a composition of motion video segments, wherein each segment is defined by a range specified in terms of temporal fields within a motion video source. The field index is used to identify portions of the compressed bitstream to be used to generate each of the motion video segments using the range defining the segment. Two or more decoders are used to process, alternatingly, the identified portions of the compressed bitstream for each of the motion video segments.

Another aspect of the invention is a process for enabling each intraframe image in a compressed bitstream of motion video data compressed using intraframe and interframe techniques to be randomly accessed. The compressed bitstream is processed to detect state information. The detected state information is added to the bitstream for each intraframe compressed image, thereby allowing random access to any intraframe compressed image.

Another aspect of the invention is a process for generating a field index for a compressed bitstream of motion video data compressed using intraframe and interframe techniques. In this process the number of video fields represented by each compressed image is determined. The compressed image which is used to start decompressing the bitstream to obtain the temporal field is then identified. A field index entry is then generated for each temporal field which maps the temporal field to an offset in the bitstream of the compressed motion video data which is used to start decompressing the bitstream to produce the temporal field. The index may be accessed using as an input an indication of the desired temporal field.

Another aspect of the invention is a circuit for decoding a plurality of motion video data streams compressed using interframe and intraframe techniques. This circuit includes a plurality of decoders for decoding the compressed video data. An interface receives the compressed video data, and provides the compressed video data to the decoders. This interface eliminates from the bitstream applied to each decoder any data corresponding to bidirectionally compressed images that would otherwise be used by the decoder to generate fields prior to the desired field. A switch connected to the output of the decoders controls which fields of motion video are output from the decoders so that only those fields within a range of specified temporal fields are output.

Other aspects of the invention include the processes and systems or circuits corresponding to the foregoing aspects of the invention, and their various combinations.

BRIEF DESCRIPTION OF THE DRAWINGS

In the drawings,

FIG. 5 illustrates the relationship of the bitstream order of compressed data to temporal fields and the field index;

DETAILED DESCRIPTION

The present invention will be more completely understood through the following detailed description which should be read in conjunction with the attached drawing in which similar reference numbers indicate similar structures. All references cited herein are hereby expressly incorporated by reference.

Figure 1:
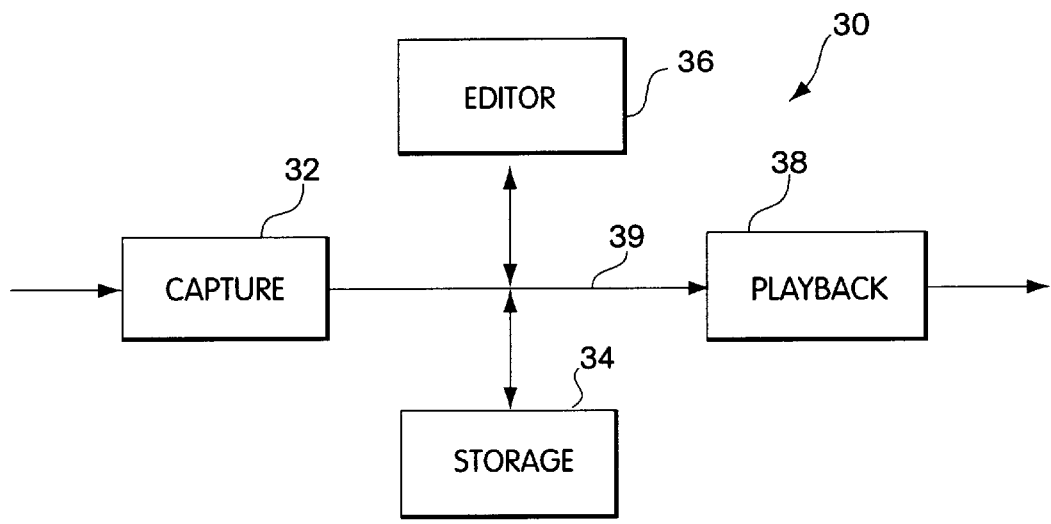
FIG. 1 is a block diagram of a video editing system.

Referring now to FIG. 1, the primary components of a typical non-linear video editing system 30 are shown. The editing system includes a capture system 32 which receives video and/or audio information from an analog or digital source, converts the information to a desired format and stores the information in a storage system 34. The capture system 32 may receive uncompressed motion video information and compress it using intraframe and/or interframe techniques. Alternatively, it may receive already compressed data. The compressed motion video data is processed in a manner described below to allow random access to each intraframe compressed image. The storage system typically stores data in data files accessible by other application programs through the file system of an operating system. For example, the capture system 32 may be an application program, or part of an application program, which writes incoming data into data files using operating system commands that access files in the file system. The storage system 34 is typically one or more computer-readable and writable disks. The editing system 30 also includes an editor 36. The editor typically manipulates a representation of a motion video program which includes references to files stored in storage 34 and ranges within those files for the multimedia content to be included in the edited motion video program. A playback system 38 is also part of the editing system 30 and is used to playback the edited motion video program, as well as to display information from storage system 34 during the editing process. Accordingly, an editor 36 may also include playback system 38.

The system shown in FIG. 1 may be implemented on one computer, or on several computers. For example, a single standalone computer with application programs defining the functionality of the capture system 32, editor 36 and playback system 38 and having an appropriate storage system 34 can be provided. In addition, the capture system 32, editor 36, playback system 38 and storage system 34 may be separate machines that interact, for example, using a client/server protocol over a network 39.

Figure 2:
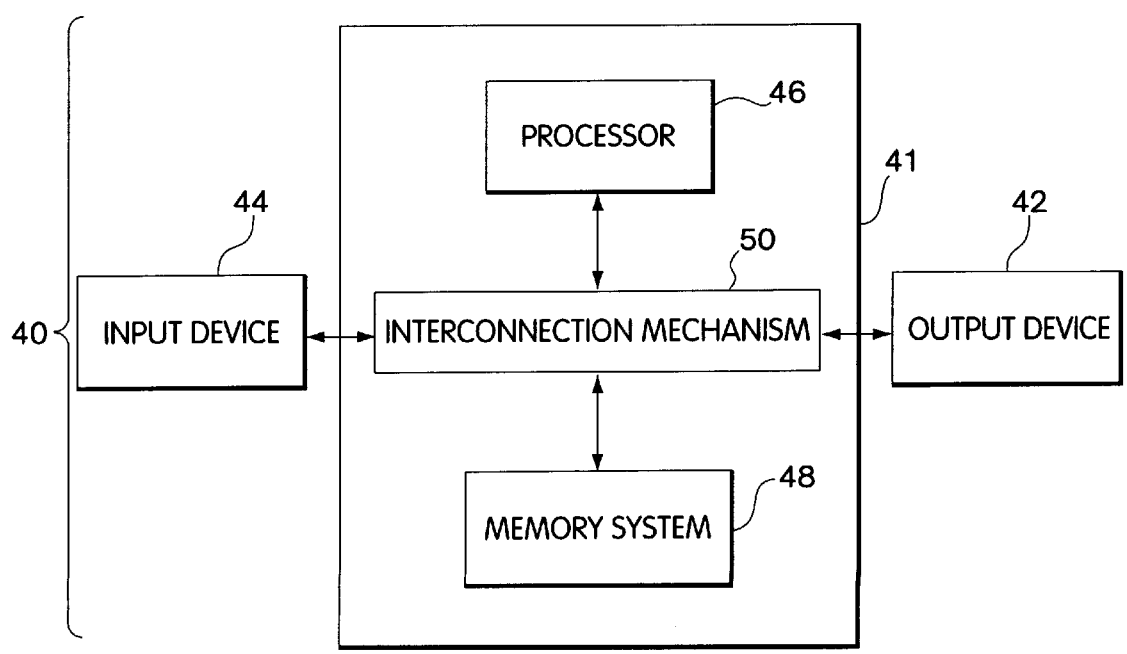
FIG. 2 is a block diagram of a computer system which may be used to implement one or more of the elements of FIG. 1.

Referring now to FIG. 2, a typical computer system 40 which may be used to implement any or all of the elements of FIG. 1 will now be described. The computer system 40 typically includes an output device 42 which displays information to a user. The computer system includes a main unit 41 connected to the output device 42 and an input device 44, such as a keyboard. The main unit 41 generally includes a processor 46 connected to a memory system 48 via an interconnection mechanism 50. The input device 44 also is connected to the processor 46 and memory system 48 via the interconnection mechanism 50, as is the output device 42.

It should be understood that one or more output devices may be connected to the computer system. Example output devices include a cathode ray tube (CRT) display, liquid crystal displays (LCD), printers, communication devices such as a modem, and audio output the playback system may access an output device that decodes compressed images for output to a display. It should also be understood that one or more input devices may be connected to the computer system. Example input devices include a keyboard, keypad, track ball, mouse, pen and tablet, communication device, video and audio input for capture and scanner. It should be connected over a computer network.

The implementation of one embodiment of the capture system 32 will now be described. The capture system generally processes incoming audio or video data and processes it into storage files on storage system 34 as described above. This general process is well-known. Received video data may be compressed by the capture system using interframe and/or intraframe techniques, or the capture system may receive a previously compressed bitstream that was compressed using interframe and intraframe techniques. In order to allow for random access to each intraframe compressed image in the compressed bitstream, the bitstream is reformatted. In particular, any state information which is used to decode and/or display the compressed image data is copied and inserted into appropriate points within the bitstream. In addition, a field index is generated which maps each temporal field in the decompressed motion video to the offset in the compressed bitstream of the data used to decode the field.

Figure 3:
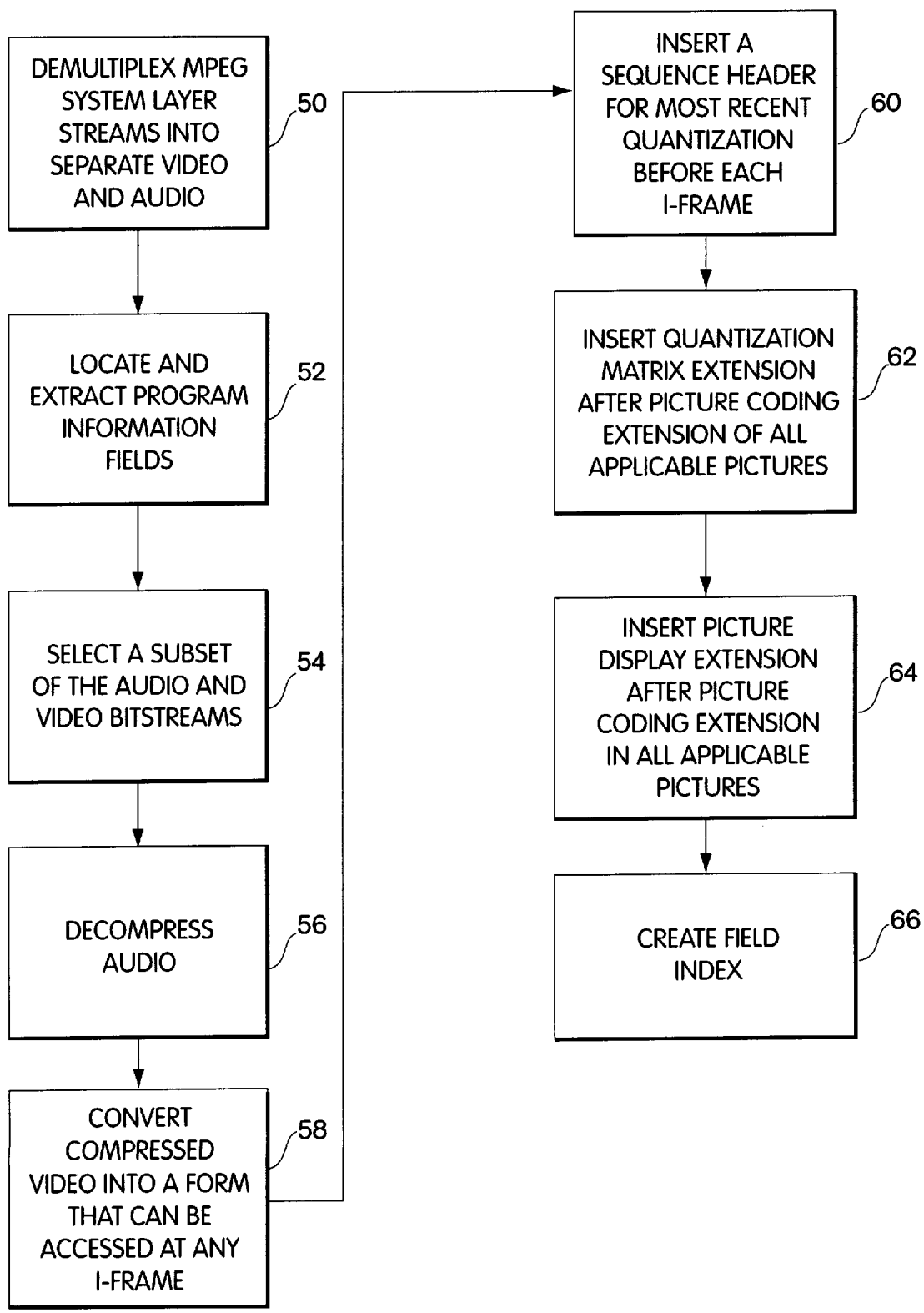
FIG. 3 is a flowchart describing how an MPEG-2 bitstream is reformatted in one embodiment of the present invention.

The process of reformatting a compressed bitstream will now be described in connection with FIG. 3. The following description uses MPEG-2 as an example compression format that provides both intraframe and interframe compression. It should be understood that the invention is applicable to other kinds of compression using interframe and intraframe techniques and that this description of the invention is provided by way of example only.

The process of reformatting the compressed bitstream to enable random access to any intraframe compressed image may be performed during the capture process while a video stream is being encoded or as a post-processing or importation step performed on previously compressed data. This process is performed because many parameters in an MPEG-2 bitstream can be specified once and then are applied to all subsequent images. These parameters are specified in headers and may specify values such as a sequence header, sequence extension, sequence display extension, sequence scalable extension, quantization matrix extension and picture display extension. The various headers are described in more detail in the MPEG-2 specification. The parameters of concern are not headers that provide mere information, such as a copyright header or a "GOP" header, but rather those that affect decoding and display. If any headers occur after the first picture in the compressed bitstream, and if they actually change any of the state that applies to the decoding and display of subsequent images, then the bitstream is reformatted to insert the headers before each subsequent I-frame following the first such change.

The first step 50 of this process is demultiplexing MPEG-2 system layer streams into separate audio and video Packetized Elementary Streams (PES) or Elementary Streams (ES). understood the invention is not limited to the particular input or output devices used in combination with the computer system or to those described herein.

The computer system 40 may be a general purpose computer system which is programmable using a high level computer programming language, such as "C, or "Pascal." The computer system may also be specially programmed, special purpose hardware. In a general purpose computer system, the processor is typically a commercially available processor, of which the series x86 processors, available from Intel, and the 680X0 series microprocessors available from Motorola are examples. Many other processors are available. Such a microprocessor executes a program called an operating system, of which UNIX, DOS and VMS are examples, which controls the execution of other computer programs and provides scheduling, debugging, input/output control, accounting, compilation, storage assignment, data management and memory management, and communication control and related services. The processor and operating system define a computer platform for which application programs in high-level programming languages are written.

A memory system typically includes a computer readable and writeable nonvolatile recording medium, of which a magnetic disk, a flash memory and tape are examples. The disk may be removable, known as a floppy disk, or permanent, known as a hard drive. A disk has a number of tracks in which signals are stored, typically in binary form, i.e., a form interpreted as a sequence of one and zeros. Such signals may define an application program to be executed by the microprocessor, or information stored on the disk to be processed by the application program. Typically in operation, the processor causes data to be read from the nonvolatile recording medium into an integrated circuit memory element, which is typically a volatile, random access memory such as a dynamic random access memory (DRAM) or static memory (SRAM). The integrated circuit memory element allows for faster access to the information by the processor than does the disk. The processor generally manipulates the data within the integrated circuit memory and then copies the data to the disk when processing is completed. A variety of mechanisms are known for managing data movement between the disk and the integrated circuit memory element, and the invention is not limited thereto. It should also be understood that the invention is not limited to a particular memory system.

It should be understood that the invention is not limited to a particular computer platform particular processor, or particular high-level programming language. Additionally, the computer system 40 may be a multiprocessor computer system or may include multiple computers Next, in step 52, program information fields may be located and extracted from the bitstream. Examples of these fields include a program map table in a transport stream or a program stream map in a program stream. The program information defines the association of audio and video bitstreams as programs. A subset of the audio and video bitstreams then is selected in step 54 for import from a system stream. Audio may be decompressed in step 56 (either MPEG audio or AC-3 audio) and stored as PCM (AIFC) data, for example in a separate data file. Editing of the uncompressed audio commonly is done. Alternately, compressed audio data may be stored and edited. Editing of such compressed audio data in a random access manner also may involve techniques similar to those used for editing compressed video due to dependencies created by compression.

The compressed video is then converted in step 58 into a form that can be accessed at any I-frame, by inserting appropriate MPEG-2 headers. The import process begins with this step 58 if the compressed data file contains only video data. In particular, as discussed above MPEG-2 bitstreams are linear media that include state information, which may be specified at a certain point in the bitstream, and which takes effect for all compressed video pictures that follow, or all that follow until a reset condition occurs in the bitstream. Consequently, in order to be able to start decoding a bitstream at any arbitrary and randomly accessed I-frame, some state information may need to be repeated before all subsequent I-frames in order for the decoder to be set to the state it would have been in if it had decoded the bitstream linearly from its start. Specific examples are given in the next three steps. These cover the case of state information called Main Profile, Simple Profile and 4:2:2 Profile. For SNR Profile, Scaleable Profile and High Profile, additional headers would have to be inserted in a similar manner.

In particular, if any quantization tables are present in any sequence header after the first sequence header, then a sequence header with the most recently occurring set of quantization tables is inserted just prior to each coded I-frame for the rest of the bitstream, in step 60. In the case of MPEG-2, a sequence extension also is inserted each time a sequence header is inserted. Also in the case of MPEG-2, if a sequence display extension occurs following the first sequence header, then a sequence display extension is inserted after the sequence extension each time a sequence header and sequence extension is inserted.

Similarly, if a quantization matrix extension occurs following the picture coding extension of any coded picture then a quantization matrix extension is inserted, in step 62, following the picture coding extension of all subsequent pictures to which the matrices in the quantization matrix extension apply until either another quantization matrix extension occurs or the next sequence header occurs.

Next, in step 64, if a picture display extension occurs following any picture coding extension, then a picture display extension with the most recently decoded frame center offset is inserted following all subsequent picture coding extensions until either another picture display extension occurs or the next sequence header occurs.

The import process can be avoided by digitizing and compressing the motion video so that the state information already exists in the bitstream in a manner that allows random access to and playback from any intraframe compressed image. In particular, the encoder should implement the following constraints. First, to properly insert sequence headers, the encoder is set up to encode the bitstream such that one of the following three conditions is true: 1) there is a sequence header at the beginning of the bitstream and no other sequence header in the bitstream, or 2) there is a sequence header prior to every intraframe, or 3) there is a sequence header at the beginning of the bitstream and prior to every intraframe following the first repeat sequence header containing quantization tables which differ from the ones in the first sequence header, if there were any specified in the first sequence header, or from the default quantization tables, if no tables were specified in the first sequence header.

To properly handle quantization matrix extensions (Quant Matrix Extension or QME), the encoder is set up to encode the bitstream such that: 1) if a QME appears within an intra-picture, then a QME must appear within every intra-picture until the next sequence header is inserted, and 2) if a Quant Matrix Extension (QME) appears within an inter-picture, then a QME must appear within every inter-picture until the next sequence header is inserted.

To properly handle picture display extensions (PDE), the encoder is set up to encode the bitstream such that if a PDE appears within any compressed picture, then a PDE must appear within every compressed picture until the next sequence header is inserted.

After the MPEG stream is reformatted, or a properly formatted stream is captured, a field index is created in step 66. The field index is used to find the compressed video data which corresponds to a particular video field and to determine what compressed video data should be fed to the MPEG decoder in order to play a particular video field.

Figure 4:
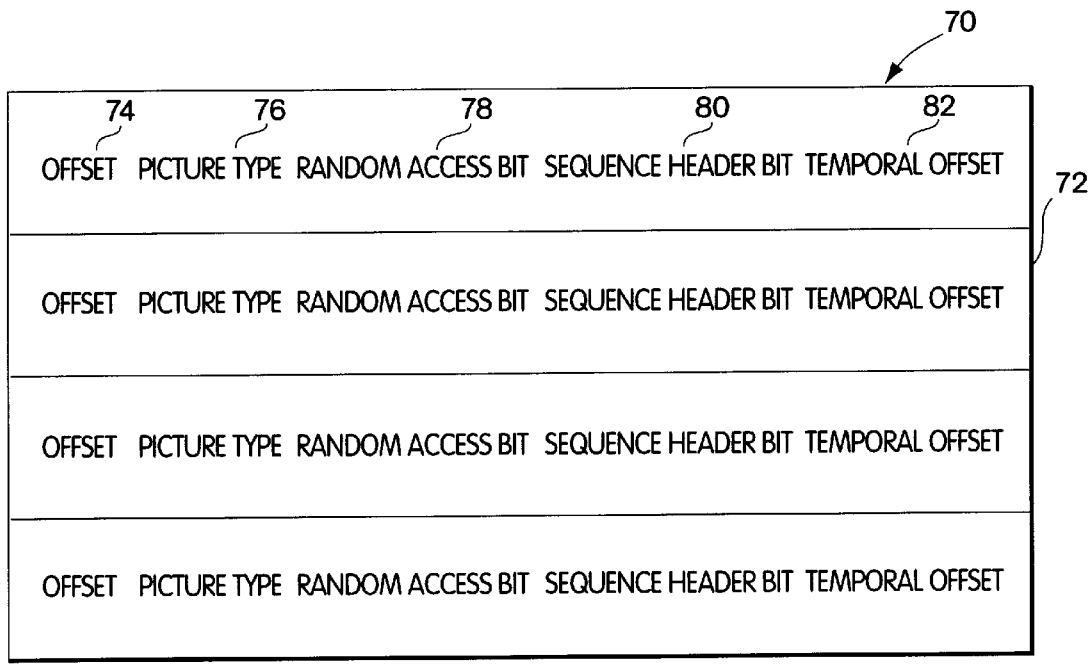
FIG. 4 illustrates one embodiment of a field index.

The format of one embodiment of the index will now be described in connection with FIG. 4. For each MPEG file, either the import process or the digitize process creates an index 70 with one entry 72 for each image, such as a field. Note that the entries 72 in the index are stored in the order in which the compressed images occur in the bitstream, i.e., the coded order and not the display order.

Each entry 72 is 64 bits long and includes an offset 74, which may be represented by 48 bits, e.g., bits 0:47. These bits are the byte offset into the bitstream (not an OMFI file) of an MPEG header which precedes the compressed picture which represents this image. If the picture is preceded by a sequence header with no intervening pictures, the index is the byte offset to the sequence header. Otherwise, if the picture is preceded by a group of pictures header with no intervening pictures, the index is the byte offset to the group of pictures header. Otherwise, the index is the byte offset of the picture header which precedes the picture.

Each entry 72 also includes an indication of the picture type 76, which may be represented by two bits, e.g., bits 48–49. Example values are: 01=I-frame, 10=P-frame, 11=B-frame. The value 00 is reserved. This is the picture type of the compressed MPEG picture found at the indicated offset 74 in the bitstream.

A random access bit 78 also is stored. This may be a single bit (e.g., bit 50) that indicates whether random access into the bitstream at the offset 74 given by this field index entry 72 is possible. A sequence header bit also may be stored to indicate whether this field index entry 72 references a sequence header. It may be represented by a single bit (e.g., bit 51). For example, if this field index entry 72 points to a picture header or a GOP header, bit 51 is zero. If this field index entry points to a sequence header, bit 51 is a one.

The last value in entry 72 is a temporal offset 82. This value signifies the offset between the temporal field number of a video field and the entry number in the field index 70 which contains the offset value of the compressed MPEG picture that contains that video field. To access video field N, where N is the temporal number of the video field of interest, field index entry N is read and the value of the temporal offset 82 which it contains is added to N. This sum is used to index into the field index 70 again to retrieve the field index entry 72 which contains the offset 74 of the compressed picture containing the field of interest.

The generation of the index may be done as a post-processing task or can be performed while motion video is being compressed. A process for indexing intraframe only sequences is described in U.S. Pat. No. 5,577,190 (Peters), which is hereby incorporated by reference. In that process, an interrupt is generated at the end of each compressed image output by the encoder. By monitoring a data buffer, an amount of compressed data used for the image is determined. In order to index sequences of interframe and intraframe compressed images, a similar technique is used, but additional information should be made available for each image at the time the interrupt is generated. In particular, the picture type of each compressed picture and the number of video fields represented by each compressed picture is needed. This information may be known in advance by the settings of the encoder. For example, the encoder may be set to use a regular group of pictures with inverse telecine (inverse 3:2 pulldown) disabled. Alternatively, the encoder may provide a separate data path, either by an output from the encoder or by registers that may be read, to output for each compressed picture: the picture type, the compressed size in bytes and the number of fields represented by the compressed picture.

An example of an MPEG bitstream and its associated field index will now be provided in connection with FIG. 5. The first section 90, labeled "Bitstream order of MPEG pictures" represents the compressed pictures found in an MPEG bitstream. The second section 92, labeled "Number of video fields represented by each coded picture," indicates the number of video fields contained in each compressed MPEG picture of the first section. The third section 94 represents the display order of the video fields in the bitstream. Each video field is numbered with a temporal field number, and is represented by a vertical line. The position of the vertical line indicates whether it is a top field or a bottom field. Line 96, labeled "MPEG pictures," indicates which MPEG pictures in the bitstream represent which temporal video fields. The MPEG pictures are now shown in temporal order rather than in bitstream order.

Lines 97–99, labeled "Field Index:Entry Number," "Field Index:Offset" and "Temporal Offset," respectively, represent the parts the Field Index 70 described above.

Figure 6:
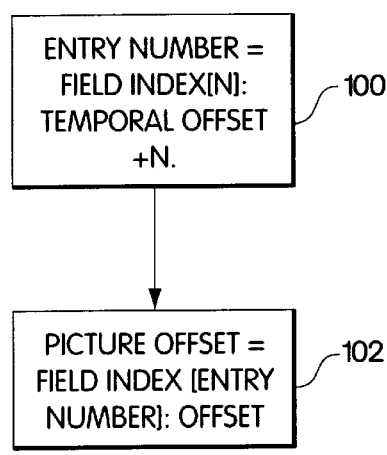
FIG. 6 is a flowchart describing how the field index is used to identify compressed image data corresponding to a temporal image field.

In order to locate an MPEG compressed picture which corresponds to the Nth temporal video field, the process shown in FIG. 6 is followed. In particular, an entry number is computed in step 100 by accessing the Nth entry 72 of the field index 70 to retrieve the value stored in the temporal offset location 82. The temporal offset value is added to the value N to obtain this entry number. The offset of the desired picture is determined in step 102 by accessing the entry corresponding to the computed entry number from step 100 from the field index 70. The offset 74 stored in the determined entry is the desired picture offset. Using the example shown in FIG. 5, if the temporal field number N is 8, the entry number is 3. The picture offset is the offset value stored in entry number 3 of the field index, which is the second field of image P3.

Having now described the content of media files containing MPEG encoded motion video and audio data, the generation of video programs by an editor will now be described in connection with FIG. 7.

Figure 7:
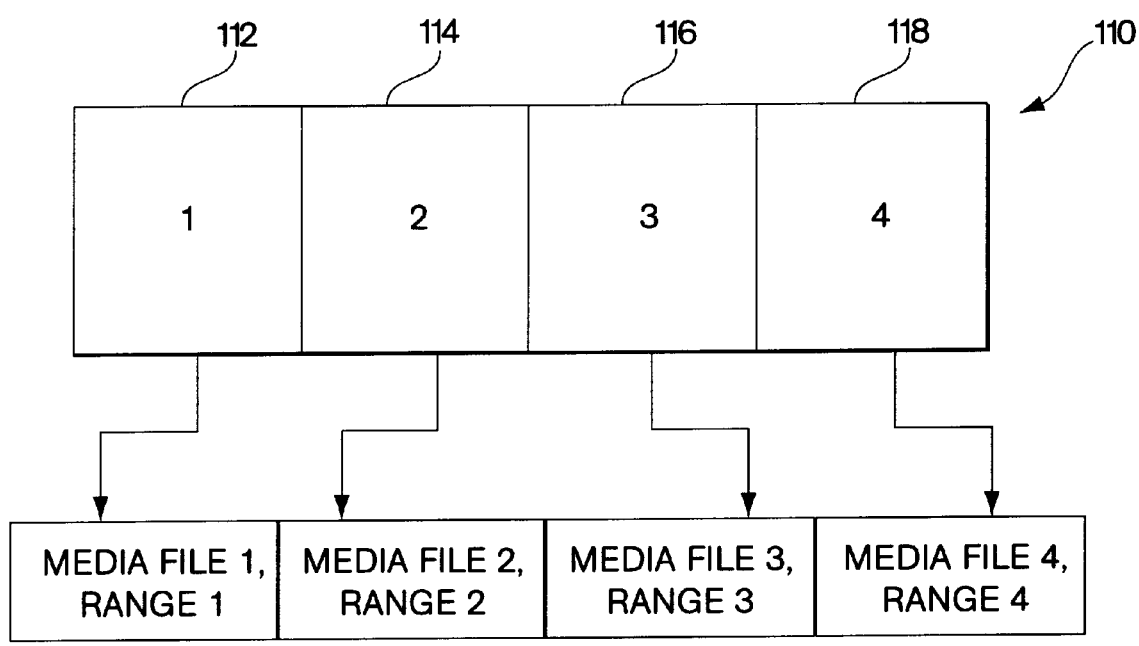
FIG. 7 is a diagram illustrating, by way of example, a representation of an edited video sequence comprised of a plurality of segments from different video sources.

In FIG. 7, a representation of video program is shown. The video program 110 includes several segments indicated at 112, 114, 116 and 118. It should be understood that there may be several more segments in the video program 110. There may be, in some instances, two tracks of video defining the video program, wherein the first and second tracks are blended or combined in some way, for example, to generate a picture in picture, to generate special effects such as dissolved transitions, or other arbitrary three-dimensional digital video effects. Each segment, e.g., 112, includes a reference to a media object which signifies a source of media data and a range within that source which is to be used to produce the segment. There are many ways to represent the structure of the video program 110, such as shown in PCT Publication WO93/21636 (Wissner) and U.S. Pat. No. 5,267,351 (Reber). The range within a file is typically represented using some indication of the temporal fields at the start and end of the segment within the source, such as by using time codes.

Given an edited sequence such as described in FIG. 7, it may be played back such as in the editing process or to generate an output providing the final video program. Such a program can be played back, as will now be described in connection with FIGS. 8–11. The playback of sequences of segments defined solely in intraframe compressed formats, and providing transitions, etc., has been described, for example, in Published PCT International Application WO94/24815 as well as U.S. Pat. No. 5,045,940 and U.S. Pat. No. 5,267,351 (Reber). In the present invention, the extension of such systems to include the capability of processing motion video compressed using both intraframe and interframe techniques to both produce effects and sequences will now be described.

A circuit in one embodiment of the invention, which handles segments of interframe and intraframe compressed video will now be described in connection with FIG. 8. This embodiment will be described using MPEG-2 as the example compression format.

Figure 8:
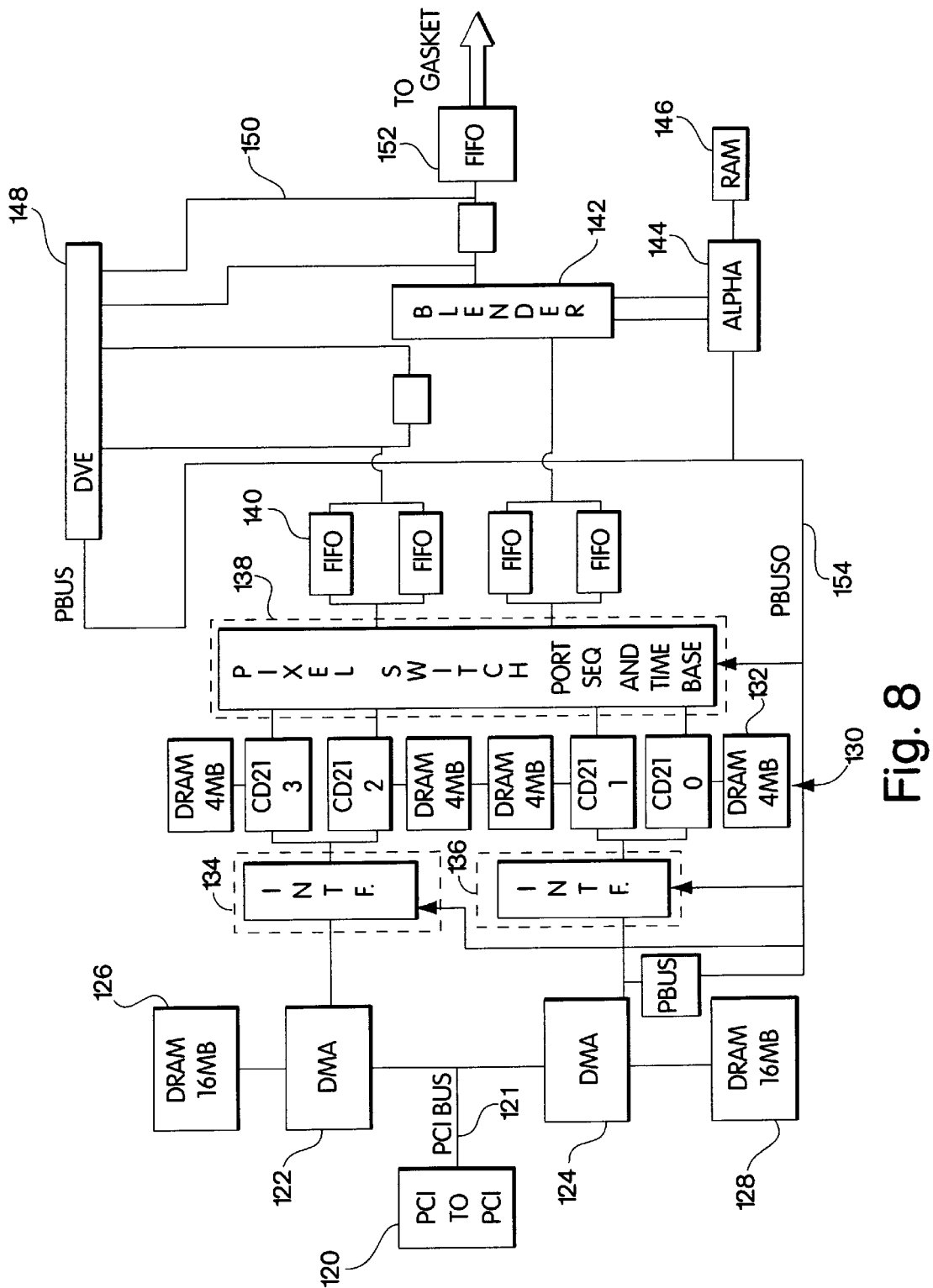
FIG. 8 is a block diagram of a circuit in accordance with one embodiment of the invention.

FIG. 8 is a circuit which is designed to connect to the peripheral connection interface (PCI) bus of a typical computer system. It should be understood that many other types of buses and connections may be used. Accordingly, the board includes a PCI interface 120. The PCI interface 120 may be implemented using a PCI to PCI bridge chip 21152 manufactured by Digital Equipment Corporation. Connected to this interface are direct memory access (DMA) controllers 122 and 124 which are responsive to commands from the host computer, particularly the playback or editor application, to handle the video data transferred from data files on the storage 34 to be played back. The DMA controllers have associated memory 126 and 128, respectively, for buffering incoming data. Each DMA controller represents one PCI load. The PCI bridge allows the use of multiple DMA controllers upon the bus 121. These DMA controllers then provide the data to four decoders indicated at 130, each of which has an associated memory 132. The interface connecting the controllers 122 and 124 to decoders 130 are indicated at 134 and 136, respectively. The decoders 130 may be, for example MPEG-2 decoders, such the MPEGME31 chip set available from International Business Machines (IBM).

A pixel switch 138 is connected to the outputs of the decoders to provide the outputs of selected decoders to buffers 140. The buffers 140 may be field buffers, containing enough data to hold one field of video information or frame buffers. The outputs of the buffers are provided to a blender 142 which is controlled by alpha and addressing circuitry 144 having associated memory 146, in a manner disclosed in PCT Publication WO94/24815. Similarly, as disclosed in PCT Publication WO94/24815, one input to the blender also may be provided to a digital video effects unit 148, while the output of the blender can be provided to another input of the digital video effects board. The output of the digital video effects board indicated at 150, is input to a buffer 152 prior to being played back to a suitable video encoder. A parameter bus 154 is used to set the various registers and memory locations and control ports of the playback circuit.

The interfaces 134 and 136 will now be described in connection with FIG. 9. These interfaces may be implemented using a field programmable gate array and act as an interface layer between the DMA controllers 122 and 124 in the decoders 130. These interfaces perform data path functions on the compressed data streams such as bus folding, address demultiplexing, marker code detection, data flushing and general interface translation.

There are three classes of data transfers that occur through these interfaces: 32-bit DMA transfers, 16-bit slave transfers and 32-bit slave transfers. DMA transfers are write transfers from the buffers 126 and 128 to the MPEG decoder FIFO space. MPEG decoders have 16-bit wide interfaces and DMA transfers are 32-bits wide. This interface folds DMA transfers into two back-to-back write cycles to the MPEG decoder video FIFO register at the MPEG decoder address 08 hexadecimal. DMA read transfers do not need to be supported by these interfaces 134 and 136. The MPEG decoder register accesses occur as read and write cycles on the parameter bus 154 and are translated to a read or write cycle on the MPEG decoder bus by the interfaces 134 and 136.

The address mapping of the MPEG decoder 16-bit wide registers through this interface is mapped to 32-bit wide space on the parameter bus 154. The data is passed on the two significant bytes of the parameter bus. Small MPEG decoder register addresses are shift left by two. MPEG decoder addresses of 02 hexadecimal are a parameter bus address 08 hexadecimal. Internal registers of the interface 134 and 136 also are aligned on four byte address boundaries and may be 32-bits in length.

Interfaces 134 and 136 also perform a byte flushing function in which they scan the DMA data passing through the data path for I, B and P picture header codes on the MPEG to video data stream. When a B picture header is encountered, this interface discards all bytes in the DMA data stream until one of the following events becomes true: 1) a header other than a B picture header is detected, or 2) a preset B picture counter decrements to zero. This byte flushing function is used because any 'B' pictures in the bitstream that occur prior to a desired video field contribute nothing to the desired output. By dropping these pictures, the time to decode a sequence of fields may be made shorter.

Another function to be performed by the interfaces 134 and 136 is picture start code detection, which allows B-pictures to be detected and discarded as described above. The detection generally enables parsing of an incoming data stream from the DMA controller for a start code sequence. In particular, the picture header and all of their MPEG headers begin with a start code of twenty-three bits of '0' followed by one bit of '1.' The picture start code immediately follows the header start code. The value for the picture start code is '00.' Therefore, the byte sequence needed to be detected for a picture header is '0x00000100.' To determine that the picture is a B-frame, the logic circuit examines the picture coding type field which is 3 bits which occurs 10 bits after the end of the picture start code. Accordingly, the total bytes string that will be scanned for is the following: 0x00000100xxcc, where cc is equal to the bit string XXpppXXX, where ppp is equal to the picture coding type. The allowed picture coding types are 001, for I picture, 010, for P picture, 011, for B picture and 100 used for D picture in MPEG-1.

Six bytes are processed in order to decode the header. These bytes are held in a post detector buffer until it is determined whether they will be used. If the picture is a B picture and B picture dropping is enabled, and the B picture counter is not at zero, then the post detector byte storage will be flushed and all incoming bytes will be dropped until the next picture start code is detected. If the above is not true, then all bytes will be passed through to the MPEG-2 decoders.

In one embodiment of the invention, the interfaces 134 and 136 are identical and one is provided for each DMA engine. Such a modular design permits two motion JPEG engines to be used in combination with one of the DMA engines instead of MPEG-2 decoders. The additional or alternative compression engines could be implemented using a daughter card to allow mixed media types.

Figure 9:
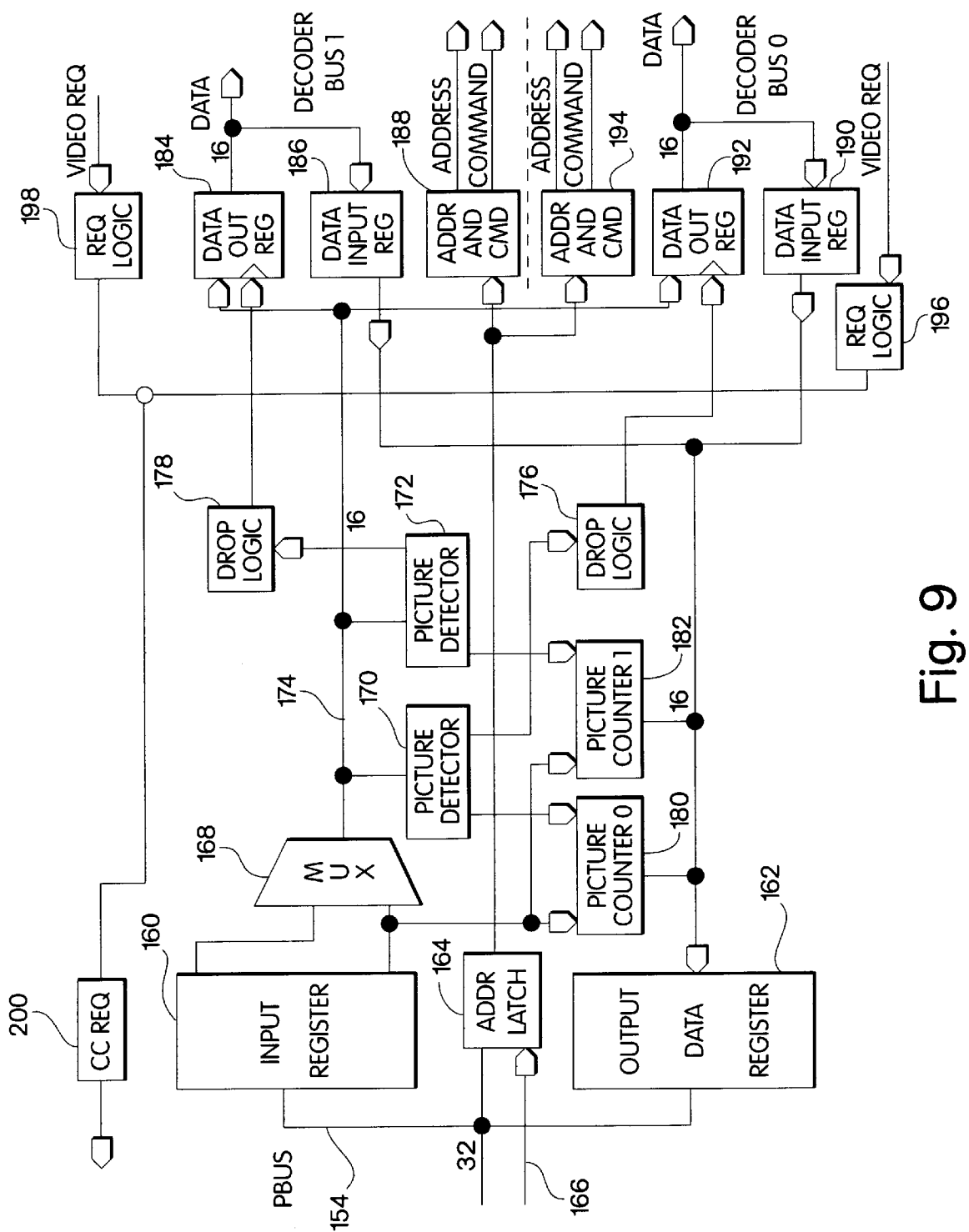
FIG. 9 is a block diagram of an interface circuit of FIG. 8.

FIG. 9 illustrates one embodiment of the interfaces 134 and 136. This figure represents one of these interfaces. The parameter bus 154 is connected to an input register 160 and an output register 162. Address data is received through an address latch 164 and through input 166. The input data received through input register 160 is applied to the multiplexer 168. Picture detectors 170 and 172 detect whether a picture is available on line 174 and whether that picture is a B-frame. Picture detector 170 is used for the first decoder while the picture detector 172 is used for the second decoder. Outputs of the picture detectors are applied to drop logic 176 and 178, respectively. Picture counters 180 and 182 keep track of the number of pictures detected by the interface. For the first channel, a data register 184 provides the output video data. A data input register 186 receives input video data from the encoder bus. Address and command register 188 outputs address and command information to the first decoder. Similar input/output and command registers 190, 192 and 194 are provided for the second decoder. In addition, video requests from the decoder are received by request logic elements 196 and 198. These request elements pass thru these requests to the DMA engine as requests 200.

Figure 10:
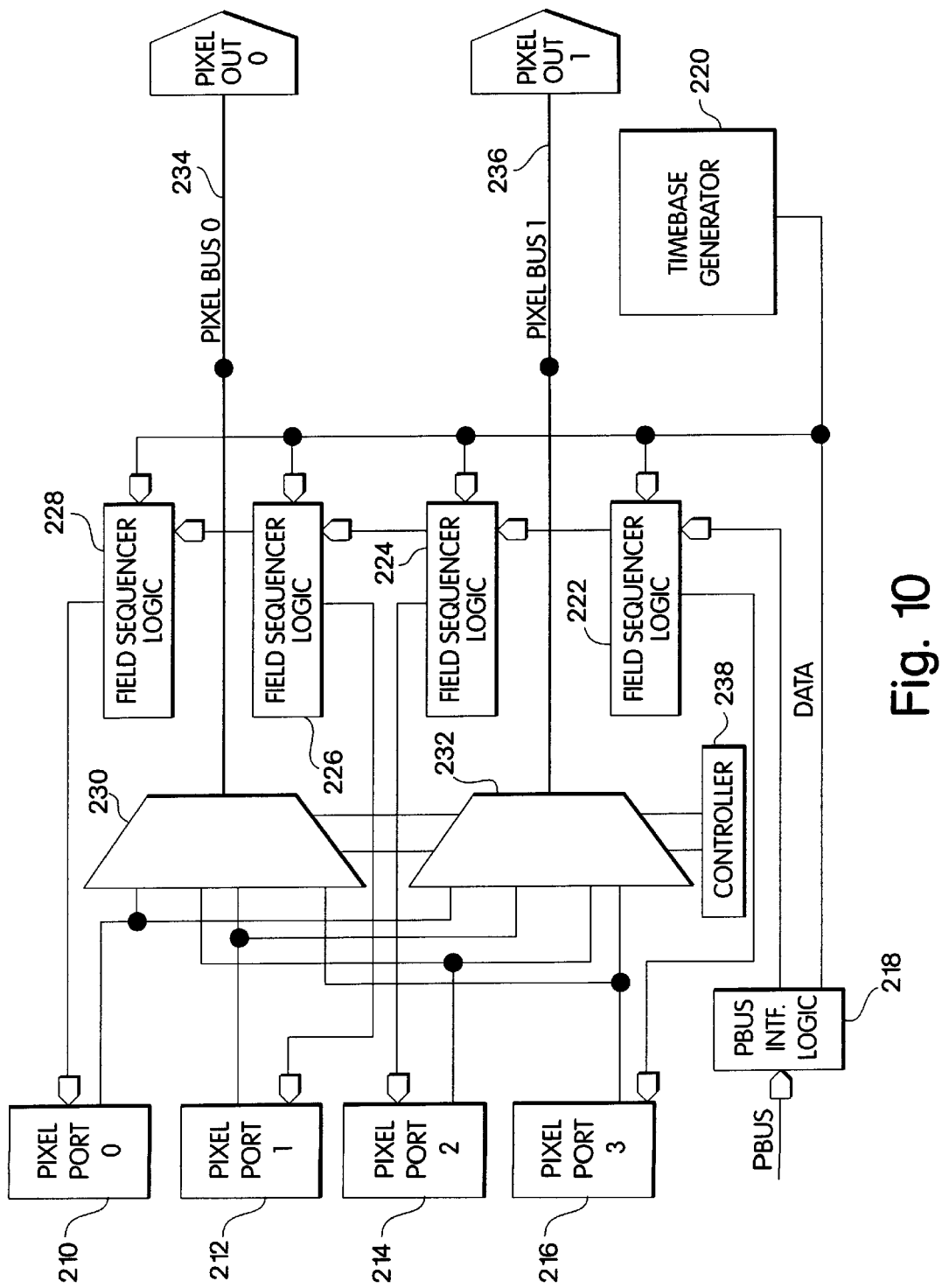
FIG. 10 is a block diagram of a pixel switch in FIG. 8.

The pixel switch 138 will now be described in connection with FIG. 10. The pixel switch includes four ports 210, 212, 214 and 216 that receive streams of pixels from the MPEG decoders. It also includes a parameter bus interface 218 which is a control register for storing control information received from the parameter bus 154 (FIG. 8) to control a time base generator 220, field sequencer logic 222, 224, 266 and 228 and multiplexer controller 238. The field sequence logic controls the pixel ports 210 through 216. Multiplexers 230 and 232 receive the output video data from all four pixel ports to be output onto respective pixel buses 234 and 236 to provide the output of the pixel switch. These multiplexers are controlled by controller 238 in accordance with the video program to be played, as will be described below.

This pixel switch acts as an interface layer between the MPEG decoders and the pixel processing pipes or channels. The pixel switch allows for the directing of one of the four MPEG pixel outputs to either pixel pipes on the circuit. The switching of the pixel switch occurs the vertical blanking interval and can be changed on a field-by-field basis, as will be described below.

The pixel switch also contains four sequencers, one for each MPEG decoder. These sequencers are responsible for advancing the decoders on a field-by-field basis. This function is used to sequence a specified decoder to any field after a specified intraframe compressed image which has been defined by the edited video program as a cut point. Each sequencer may have double buffered programmable registers used to define the number of fields to advance from either a wait state or the existing active field. Each decoder is sequenced in the correct order after reset to ensure that the sequencer knows that it is on the first field of the first frame.

The reset procedure is as follows. The playback application issues a reset to the desired decoder via the channel reset command bit of the interface 134 and 136. An initialization bit in the pixel switch control register 218 is then set. The playback application then waits for an interrupt from the sequencer 222. The port sequencer issues three vertical synchronization signals at their normal frequency of 16.6 milliseconds after a reset of the decoder. The sequencer 222 in the pixel switch enters a wait state and posts an interrupt to the PCI bus via the DMA engine and sets a flag in its status register. Upon detection of the flag set, the playback application loads the decoder micro code and rate buffer. Next, the control bit in the control register 218 is set to cause the sequencer to complete initialization. After one more vertical synchronization signal, the pixel switch waits 30 milliseconds and then issues three more vertical synchronization signals. At this point, the decoder should be outputting the first field of the first decoded picture.

When a sequencer is initialized, it is informed how many fields to advance by the contents of field contents registers. If the field skip counter for a specific decoder is equal to zero, the decoder is stalled in a wait state. This wait state is exited when the field count register is loaded with a non-zero value or that value is selected as a pixel source by this pixel switch. The field counter register is double buffered such that the written value enters a shadow register which then is loaded into the counter on the next vertical synchronization signal. The functionality of the pixel switch provides double buffered function loaded by the playback application using the parameter bus 154. If the playback application changes the source of pixels, it loads the pixel port selection bits in controller 238, which changes the source of the given pixel port at the next synchronization period.

How a playback application uses the circuit of FIGS. 8 through 10 to display arbitrary MPEG-2 encoded sequences, such as defined by a video program as shown in FIG. 7, will now be described in connection with FIG. 11.

A composition is first translated using known techniques into what may be called playback graph. For example, a playback graph may be a collection of interconnected virtual devices for use by a virtual device manager from Avid Technology, Inc., such as described in U.S. Patent Application filed on even date herewith by James Hamilton and entitled VIDEO DEVICE MANAGER FOR MANAGING MOTION VIDEO OUTPUT DEVICES AND SUPPORTING CONTEXTS AND BUFFER ADOPTION, or a filter graph using the ActiveMovie video device driver from Microsoft Corporation or Matrox Corporation. Such a graph is translated into sequences of commands to the playback circuitry and read operations on the data files containing the video data.

Figure 11:
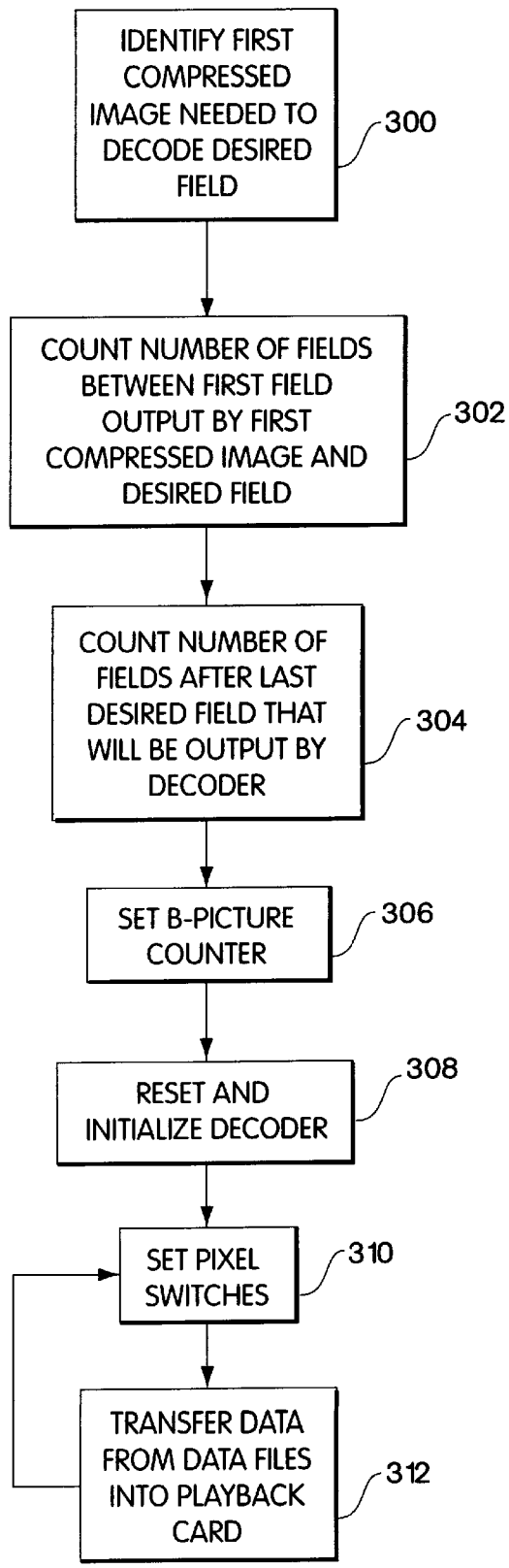
FIG. 11 is a flowchart describing how a video program representation, such as shown in FIG. 7, is translated into commands to be performed by the circuit of FIGS. 8 through 10.

Referring now to FIG. 11, the first compressed image needed in order to decode a desired field is identified using the field index in step 300. In particular, the entry in the field index containing the offset into the compressed bitstream for the specified temporal field is determined, as described above in connection with FIG. 6. Next, the closest preceding intraframe compressed image is then identified by scanning the field index backwards for the first I-frame. However, if the current frame is a B-frame, then at least two reference frames (I-frames or P-frames) must be found, where the last reference frame is the I-frame from which decoding starts. When scanning the field index backward, at least two fields are neeeded to idenfify a reference frame. Accordingly, two adjacent entries of a P-type or I-type picture constitute one frame.

The number of fields between the first field output by the first compressed image and the desired field is determined in step 302. This step may be performed by scanning the field index starting with the identified intraframe image and by logically reordering the entries (which occur in coded order) into the order in which the decoded fields would be output in a manner which emulates the decoding process. Attached as Appendix I, hereby incorporated by reference, is source code implementing the mapping of temporal ranges of MPEG encoded material. This source code includes a function "GetDOrderField" which implements the process of FIG. 6. Another function called "GetLeaderlnfo" identifies the number of fields before a specified temporal field, as described in steps 300 and 302. In addition, a number of fields that may be output by the decoder after the end of the clip is then determined in step 304, in a similar manner. This number may be anywhere from zero to six. Another pair of functions in the Appendeix, "GetEndofRange" and "GetTrailingDiscards" may be used to perform step 306.

The "B" picture counter 180 or 182 (FIG. 9) is then set in step 306 according to the value determined in step 302. The decoders then can be reset and initialized in step 308. The pixel switches then can be set in step 310. Given the initialization of steps 300 through 310, the data may be read from data files in step 312 and transmitted to the circuit for the playback. As further data is needed and as the playback of the sequence progresses, the pixel switches may be set differently and additional data may be read from data files and transferred by the DMA controller, limited by the end of the clip defined using the GetEndofRange function.

As described above, a compressed bitstream can be reformatted to add state information affecting decoding and display to allow random access to each intraframe compressed image. In addition, a field index allows a temporal field to be mapped to an offset within the bitstream of the start of compressed image data used to reconstruct that field. Information in the bitstream may be dropped prior to being provided to the decoder if it represents bidirectionally predicted images and is prior to a desired field. By dropping such data, the amount of time to decode a sequence of fields may be reduced, resulting in improved cut density. The random access and improved cut density thereby improves the ability of an editor to construct video programs including arbitrary segments of motion video data compressed using interframe and intraframe techniques.

Compressed audio can be edited in much the same way as compressed video as described herein, with multiple audio decoders and a sample dropping circuit on the output.

Having now described a few embodiments of the invention, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention as defined by the appended claims and equivalents thereto.

APPENDIX I

```
/*
 *
/--------------------------------------------------\
 * | The following programs are the sole property of Avid Technology,
Inc., |
 * | and contain its proprietary and confidential information. |
 * | Copyright 1989-1996 Avid Technology Inc. |
 *
\--------------------------------------------------/
 */
```

APPENDIX I-continued

```
/*******************************************
 *******
    MPEGMapper.c
    MPEGMapper class and function definitions
 *******************************************
 */
    #include "masterheader.h"
    #include "AMEBase.h"
    #include "MPEGMapper.h"
    #include "DIDPosition.h"
    #include "DIDDescriptor.h"
    #include "MPGIDescriptor.h"
    #include "MPEGPosition.h"
    #include "Exception.h"
    #include "memrtns.h"
    #include "MPEGDefs.h"
    #define MPEGMapperVersion       1
    #if !PORT_LEXT_INHERITED
    #undef inherited
    #define inherited AMapper
    #endif
    OBJECT_STD_C(MPEGMapper)
    MPEGMapper::MPEGMapper(void)      // OBJECT_STD_C
requires this, but don't use it
    {
        FT1Assert Not Reached();
    }
    MPEGMapper::MPEGMapper(ameBaseStream *s,
    DIDDescriptor* desc,
AvUnit_t NumSamples,
                    long SampleSize, Boolean isfixedsize)
    {
        _NFields = desc->GetFrameLayout () ==
        eSEPARATE_FIELDS ? 2 :1;
        IDIDMapper(s, desc, NumSamples * _NFields, SampleSize,
    isfixedsize, sizeof(MPEGFrameIndexEntry));
    }
    void MPEGMapper::GetBOBInfo(AvUnit_t BeginSample,
    AvUnit_t NumSamples,
                    AvUnit_t* offset, AvUnit_t*
length, Boolean* needSeqHdr)
    {
        if (!_IsFixedSize)
        {
            AvUnit_t dorderSample =
            GetDOrderField(BeginSample, FALSE);
            AvUnit_t firstIFrame = dorderSample -
GetLeaderLen(dorderSample);
            long seqHdrLen = 0;
            // add length of sequence header if needed
            *needSeqHdr = ! HaveSequenceHdr(firstIFrame);
            if (*needSeqHdr)
                seqHdrLen = ((MPGIDescriptor*)
_Desc)->GetSequenceHdr(NULL);
            *offset = GetFXOffset(firstIFrame);
            if (NumSamples)
                *length = GetEndOfRange(BeginSample, NumSamples) -
*offset + seqHdrLen;
        }
        else
        {
            *offset = 0;
            *length = NumSamples * _SampleSize;
            *needSeqHdr = FALSE;
        }
    }
APosition*
MPEGMapper::MapSample(AvUnit_t SampleNum) {
    if (!_IsFixedSize)
    {
        AvUnit_t offset;
        Boolean needSeqHdr;
        GetBOBInfo(SampleNum, 0, &offset, NULL, &needSeqHdr);
        return new MPEGPosition(offset, 0, NullMobID(),
                    NULL_TRACKLABEL, SampleNum,
0, FALSE, needSeqHdr,
                    (MPGIDescriptor*)_Desc,
this);
    }
```

APPENDIX I-continued

```
        else
            return new MPEGPosition(SampleNum * _SampleSize,
_SampleSize,
NullMobID(),
                    NULL_TRACKLABEL, SampleNum,
0, FALSE, FALSE,
                    (MPGIDescriptor*)_Desc,
this);
    }
    AvUnit_t MPEGMapper::BufferSize(AvUnit_t BeginSample,
AvUnit_t
NumSamples)
    {
        AvUnit_t offset;
        AvUnit_t length;
        Boolean needSeqHdr;
        GetBOBInfo(BeginSample, NumSamples, &offset, &length,
&needSeqHdr);
        return length;
    }
    AvUnit_t MPEGMapper::GetSampleOffset(AvUnit_t
SampleNum) {
        AvUnit_t dorderSample =
            GetDOrderField(SampleNum, FALSE);
        return GetFXOffset(dorderSample -
            GetLeaderLen(rorderSample));
    }
    AvUnit_t MPEGMapper::GetFXOffset(AvUnit_t dorderField)
    {
        if (!_IsFixedSize)
        {
            MPEGFrameIndexEntry* entryP;
            ValidateSampleNum(dorderField);
            entryP = (MPEGFrameIndexEntry*)
                (_FXPtr + 2 * (dorderField -
_rMin));
            return entryP->offsetLow + (entryP->offsetHigh << 32);
        }
        else
            return dorderField * _SampleSize;
}
int MPEGMapper::GetPictureType(AvUnit_t dorderField)
{
        if (!_IsFixedSize)
        {
            MPEGFrameIndexEntry* entryP;
            if (dorderField == _NumSamples)
                return MPEGIPicture;
            ValidateSampleNum(dorderField);
            entryP = (MPEGFrameIndexEntry*) (_FXPtr + 2 * (dorderField -
_rMin));
            return entryP->flags & MPEGPictureTypeMask;
        }
        else
            return MPEGIPicture;
}
int MPEGMapper::GetFieldOffset(AvUnit_t dorderField)
{
        int result = 0;
        if (!_IsFixedSize)
        {
        AvUnit_t curFXOffset;
        AvUnit_t ix = dorderField;
        curFXOffset = GetFXOffset(ix);
        ix--;
        while (ix >= 0 && GetFXOffset(ix) == curFXOffset)
        {
            ix--;
            result++;
        }
        }
        return result;
}
Boolean MPEGMapper::HaveSequenceHdr(AvUnit_t dorderField)
{
        if (!_IsFixedSize)
        {
            MPEGFrameIndexEntry* entryP;
            if (dorderField == 0)
                return TRUE;
            ValidateSampleNum(dorderField);
            entryP = (MPEGFrameIndexEntry*) (_FXPtr + 2 * (dorderField -
_rMin));
            return (entryP->flags & MPEGSSequenceHdrBit) != 0;
        }
        else
            return TRUE;
}
//Get DOrderField returns the disk order sample index corresponding
//to the picture which will produce the Nth temporal order frame.
//This is determined by a delta stored in the frame index.
AvUnit_t MPEGMapper::GetDOrderField(AvUnit_t
SampleNum, Boolean lastField)
{
        AvUnit_t result = _NFields * SampleNum;
        MPEGFrameIndexEntry* entryP;
        if (last Field)
            result += _NFields - 1;
        if (!_IsFixedSize)
        {
            Validate SampleNum(result);
            entryP = (MPEGFrameIndexEntry*) (_FXPtr + 2 * (result -
_rMin));
            return min(result + entryP->toDoDelta, _NumSamples-1);
        }
        else
            return result & 1;
}
        //GetFieldPairing does a localized search to determine whether the
given field (in disk order)
        // is the first or second field of a pair. This is primarily needed
when field-based coding is
        // involved. The method returns zero for the first field of a pair,
and one for the second.
        //As a special case, if the given field is part of a multi-field
picture, the field offset is returned.
        int MPEGMapper::GetFieldPairing(AvUnit_t SampleNum)
        {
            const long searchLimit = 100;
            AvUnit_t ix = SampleNum;
            AvUnit_t fxOffset = GetFXOffset(ix);
            AvUnit_t origFXOffset = fxOffset;
            int pType = GetPictureType(ix);
            int nextPType;
            AvUnit_t nextOffset;
            id (SampleNum > _NumSamples-SampleNum) //search
backwards
            {
                while (SampleNum - ix < searchLimit && ix > 0)
                {
                    ix--;
                    nextPType = GetPictureType(ix);
                    //if the ptypes are different then we know that ix
is the second field of a pair,
                    //unless the types are IP, which is ambiguous, so we
continue (yes, I know this is suboptimal).
                    if (ptype != nextPType && (pType != MPEGPPicture ||
nextPType != MPEGIPicture))
                        return (SampleNum - ix + 1) & 1;
                    nextOffset = GetFXOffset(ix);
                    //if there is ever a multi-field picture, then we
know that the field we're on is even
                    if (nextOffset == fxOffset)
                    {
                        if (fxOffset == origFXOffset) //special
case
                            return GetFieldOffset(SampleNum);
                        return (SampleNum - ix) & 1;
                    }
                    fxOffset = nextOffset;
                    pType = nextPType;
                }
            }
            else
            search forwards
            {
                while (ix - SampleNum < searchLimit)
                {
```

APPENDIX I-continued

```
        ix++;
        nextPType = GetPictureType(ix);
        if (pType != nextPType && (pType != MPEGIPicture ||
nextPType != MPEGPPicture))
            return (ix - SampleNum) & 1;
        nextOffset = GetFXOffset(ix);
        if (nextOffset == fxOffset)
        {
            if (fxOffset == origFXOffset) //special
case
                return GetFieldOffset(SampleNum);
            return (ix - 1 - SampleNum) & 1;
        }
        fxOffset = nextOffset;
        pType = nextPType;
    }
}
    return 0; //unknown - guess and hope for the best
}
long MPEGMapper::GetLeaderLen(AvUnit_t dorderField)
{
    AvUnit_t ix = dorderField;
    if (_NFields == 1) //One field case is simpler, and
two-field code may not work for progressive sequence
    {
        u_char desiredPType = GetPictureType(ix);
        u_char pType = desiredPType;
        int nPPics = 0;
        while (ix > 0 && (pType != MPEGIPicture || (desiredPType ==
MPEGBPicture && nPPics == 0)))
        {
            ix--;
            pType = GetPictureType(ix);
            if (pType == MPEGPPicture)
                nPPics++;
        }
        //continue to first field of the I-picture we just found
        ix -= GetFieldOffset(ix);
    }
    else //two-field case -- we need a reference field of each
parity
    {
        u_char fieldParity = 0; //initial setting is
arbitrary since we need one or two of each
        u_char nRefFields[2] = { 0, 0 };
        u_char nIFields[2] = { 0, 0 };
        u_char lastPType = GetPictureType(ix);
        int BCount = 0;
        int prevBCount = 0;
        int fieldPairing = GetFieldPairing(ix);
        if (lastPType != MPEGBPicture)
        {
            nRefFields[0] = nRefFields[1] = 2; //
don't bother counting ref fields - only I's
            if (lastPType == MPEGIPicture)
            {
                nIFields[0] = 1;
                if (GetPictureType(ix+1) == MPEGIPicture)
                    nIFields[1] = 1;
            }
            //if we are going to scan, we need to know the
parity of this field relative to the preceding
            //which means we have to count B fields follwing
this frame
            if (nIFields[1] == 0)
            {
                AvUnit_t ix2 = ix + 1;
                while (ix2 < _NumSamples && GetPictureType(ix2)
== MPEGBPicture)
                    ix2++;
                prevBCount = ix2 - ix - 1;
            }
        }
        while (ix > 0 && (fieldPairing > 0 ||
            nIFields[0] == 0 || nIFields[1] == 0 ||
nRefFields[0] < 2 || nRefFields[1] < 2))
        {
            int pType;
            ix--;
            pType = GetPictureType(ix);
            if (pType == MPEGBPicture)
                BCount++;
            else //I or P
            {
                if (lastPType == MPEGBPicture || fieldPairing <
                {
                    fieldPairing = min(1,
GetFieldOffset(ix)-1);
                    fieldParity = (fieldParity + prevBCount +
1) & 1;
                    prevBCount = BCount;
                    BCount = 0;
                }
                else
                {
                    fieldParity = (fieldParity + 1) & 1;
                    fieldPairing--;
                }
                nRefFields[fieldParity] ++;
                if (pType == MPEGIPicture)
                    nIFields[fieldParity] ++;
            }
        }
        return dorderField - ix;
    }
}
//GetLeaderInfo returns all required information about the "leader",
which is the
//sequence of pictures that must be input to the decoder in order to
get out a given
//frame. The SampleNum input is the index of the desired frame. If
the given SampleNum
//is not a B-picture, then there may be B-pictures following it that
will come out first
//and need to be discarded as well. The MPEGLeaderInfo_t contains
this information as well.
//The algorithm is: if the given frame is an I-picture, the leader
length is zero.
//If the given frame is a P-picture, the leader extends to the
preceding I-picture.
//If the given frame is a B-picture, the leader extends to either the
preceding I-picture
//if there id a P-picture intervening, or the second preceding
I-picture if there is no
//P-picture intervening.
void MPEGMapper::GetLeaderInfo(AvUnit_t SampleNum,
AvUnit_t NumSamples,
                    MPEGLeaderInfo_t*
leaderInfo)
{
    int i;
    AvUnit_t dorderFirstField = GetDOrderField(SampleNum, False);
    int firstFieldOffset = GetFieldOffset(dorderFirstField);
    int leadingFields = GetLeaderLen(dorderFirstField) -
firstFieldOffset;
    AvUnit_t startOfLeader = dorderFirstField - leadingFields;
    AvUnit_t ix;
    AvUnit_t prevFXOffset;
    AvUnit_t newFXOffset;
    int pendingIPDiscards;
    u_char pType;
    int leadingDiscard = ((MPGIDescriptor*)
_Desc)->GetLeading_Discard() ? 1 : 0;
    int dorderZero = -1;
    //if we're playing more than one frame, then we read and discard
any B-pictures following
    //an initial I or P
    if (GetPictureType(dorderFirstField) != MPEGBPicture &&
NumSamples > _NFields)
    {
        AvUnit_t nextPic = FindNextPicture(dorderFirstField);
        //Scan for following B-pictures, if we need any to play
the desired range
        if (nextPic - dorderFirstField < NumSamples * _NFields)
        {
            AvUnit_t ix2 = nextPic;
            while (ix2 < _NumSamples && GetPictureType(ix2) ==
MPEGBPicture)
```

APPENDIX I-continued

```
            ix2++;
            if (ix2 > nextPic)
                leadingFields = ix2 - startOfLeader; //
includes actual first picture in this case
        }
    }
    //discard any initial fields output from the first picture that
we don't need
        //we count the rest of the discards below
        leaderInfo->leading DiscardFields = firstFieldOffset;
        //add in an extra field if we are playing from start of clip and
clip starts with bottom field
        if (SampleNum == 0)
            leaderInfo->leadingDiscardFields += leadingDiscard;
        else if (startOfLeader <= 3 && leadingDiscard)
            dorderZero = GetDOrderField(0, FALSE);
        pendingIPDiscards = 0;
        //now build the frameIndexInfo list
        i = 0;
        ix = startOfLeader;
        pType = MPEGIPicture;
        lesderInfo->frameIndexInfo[0].nFields = 0;
        prevFXOffset = newFXOffset = GetFXOffset(startOfLeader);
        while (TRUE)
        {
            if (newFXOffset == prevFXOffset)
            {
                leaderInfo->frameIndexInfo[i].nFields++;
            }
            else
            {
                leaderInfo->frameIndexInfo[i].pictureType = pType;
                leaderInfo->frameIndexInfo[i].pictureLength =
newFXOffset - prevFXOffset;
                if (pType == MPEGBPicture)
                    leaderInfo->leadingDiscardFields +=
leaderInfo->frameIndexInfo[i].nFields;
                else
                    pendingIPDiscards =
leaderInfo->frameIndexInfo[i].nFields;
                pType = GetPictureType(ix);
                if (pType != MPEGBPicture)
                    leaderInfo->leadingDiscardFields +=
pendingIPDiscards;
                i++;
                leaderInfo->frameIndexInfo[i].nFields = 1;
            }
            if (ix >= startOfLeader+leadingFields)
                break;
            if (ix == dorderZero)
                leaderInfo->frameIndexInfo[i].nFields +=
leadingDiscard;
            ix++;
            prevFXOffset = newFXOffset;
            newFXOffset = GetFXOffset(ix);
        }
        leaderInfo->leaderLength = i;
}
//FindNextPicture: given a disk-order FX position, return the FX
position of the next disk-order
//picture in the index
AvUnit_t MPEGMapper::FindNextPicture(AvUnit_t ix)
{
    AvUnit_t fxOffset = GetFXOffset(ix);
    while (++ix < _NumSamples && GetFXOffset(ix) == fxOffset) {}
    return ix;
}
//GetEndOfRange returns the offset of the first picture following the
range that does
//not need to be read.from the file in order to contain all of the
frames in the given range.
//There are some tricky parts:
//(1) if the last temporal picture is I or P then some number of B
pictures
//following it may be included in the range (either all or none,
actually). And
//(2) the frame may cross picture boundaries, as indicated by field
offsets, and
//(3) the next disk order frame may be part of the same picture, so
that we have to
//look further to find the frame index entry corresponding to the next
disk-order picture
AvUnit_t MPEGMapper::GetEndOfRange(AvUnit_t SampleNum,
AvUnit_t NumSamples)
{
    AvUnit_t dorderLastSample = GetDOrderField(SampleNum +
NumSamples - 1, TRUE);
    int pType = GetPictureType(dorderLastSample);
    AvUnit_t nextPict = FindNextPicture(dorderLastSample);
    if (pType != MPEGBPicture && NumSamples * _NFields >
nextPict - dorderLastSample)
    {
        while (nextPict < _NumSamples && GetPictureType(nextPict) ==
MPEGBPicture)
            nextPict++;
    }
    return GetFXOffset(nextPict);
}
//GetTrailingDiscards returns the number of fields that will be output
from a decoder following
//play of the frame at SampleNum. This includes two components: (1)
if the last field to be played
//comes from a B-picture, then the preceding I or P picture will come
out with as many fields as it
//is supposed to produce, and (2) the picture the produces the last
field may produce more fields than
//desired to be played.
int MPEGMapper::GetTrailingDiscards(AvUnit_t SampleNum)
{
    AvUnit_t dorderLastSample =
GetDOrderField(SampleNum, TRUE);
    int pType = GetPictureType(dorderLastSample);
    int result = 0;
    AvUnit_t ix;
    AvUnit_t lastDOrderField;
    if (pType == MPEGPicture)
    {
        //find the preceding I or P
        ix = dorderLastSample - 1;
        while (ix > 0 && GetPictureType(ix) == MPEGBPicture)
            ix--;
        //now count its fields (there will always be at least two,
by the pairing rule)
        result += 1 + min(1, GetFieldOffset(ix));
        lastDOrderField = ix;
    }
    else
        lastDOrderField = FindNextPicture(dorderLastSample) - 1;
    //now count any extra fields in the last picture
    result += lastDOrderField - dorderLastSample;
    //if last picture is also last in clip, there may be one more
    //the reason for the extra funny is to avoid moving the FX
cache to the end if we are nowhere
    //near the end
    if ((MPGIDescriptor*) _Desc)->GetTrailingDiscard() &&
(_NumSamples-lastDOrderField < 256) &&
        lastDOrderField == GetDOrderField(_NumSamples/_NFields-1,
TRUE))
        result++;
    return result;
}
void MPEGMapper::SetSampleOffset(AvUnit_t SampleNum,
AvUnit_t Offset)
{
    DoesNotImplement();
}
void MPEGMapper::WriteFrameIndex(void)
{
    DoesNotImplement();
}
void
MPEGMapper::SetSampleSize(AvUnit_t NumSamples,long SampleSize)
{
    DoesNotImplement();
}
    /*
    *
/-----------------------------------------\
```

APPENDIX I-continued

```
*  | The following programs are the sole property of
Avid Technology, Inc., |
    *  | and contain its proprietary and confidential information. |
    *  | Copyright 1989–1996 Avid Technology Inc. |
    *
\--------------------------------------------------/
    */
    #ifndef __MPEG__MAPPER__H
    #define __MPEG__MAPPER__H
    /*********************************************
*********
    MPEGMapper.h
    MPEGMapper class and function definitions
*****************************************************
    */
    #include "DIDMapper.h"
    #include "MPEGDefs.h"
    class MPGIDescriptor;
    typedef struct {
        char   toDoDelta;  //temporal order to disk order
delta (signed)
            u_char      flags;
            u_short     offsetHigh;
            u_long      offsetLow;
    }MPEGFrameIndexEntry;
    //Content of flags;
    #define MPEGPictureTypeMask 0x0003
    #define MPEGRandomAccessBit 0x0004
    #define MPEGSequenceHdrBit 0x0008
    class MPEGMapper: public DIDMapper
    {
        OBJECT_STD_H(MPEGMapper)
    public:
        MPEGMapper(void); //OBJECT_STD_C requires this, but don't
use it
MPEGMapper(amBaseStream *s, DIDDescriptor* desc, AvUnit_t
NumSamples,
            long SampleSize, Boolean isfixedsize);
        virtual APosition* MapSample(AvUnit_t SampleNum);
        virtual AvUnit_t BufferSize(AvUnit_t BeginSample, AvUnit_t
NumSamples);
        virtual void SetSampleOffset(long SampleNum, long Offset);
        virtual long GetSampleOffset(long SampleNum);
        virtual void WriteFrameIndex(void);
        virtual void SetSampleSize(AvUnit_t NumSamples,
            long SampleSize);
        //the following are "private" methods used either internally, or
only by the MPEGreader
        void GetBOBInfo(AvUnit_t BeginSample, AvUnit_t
NumSamples,
                        AvUnit_t* offset,
AvUnit_t* length, Boolean* needSeqHdr);
        void GetLeaderInfo(AvUnit_t SampleNum, AvUnit_t
NumSamples,
                        MPEGLeaderInfo_t*
leaderInfo);
        AvUnit_t GetEndOfRange(AvUnit_t SampleNum, AvUnit_t
NumSamples);
        int GetTrailing_Discards(AvUnit_t SampleNum);
        AvUnit_t GetDOrderField(AvUnit_t SampleNum, Boolean
lastField);
        //the following all operate on field position
(normally temporal) not frame (sample) number
        int GetPictureType(AvUnit_t dorderField);
        Boolean HaveSequenceHdr(AvUnit_t dorderField);
    protected: //these really are private
        int GetFieldOffset(AvUnit_t dorderField);
        long GetLeaderLen(AvUnit_t dorderField); //
SampleNum is disk-order
        AvUnit_t GetFXOffset(AvUnit_t dorderField);
        AvUnit_t FindNextPicture(AvUnit_t ix);
        int GetFieldPairing(AvUnit_t SampleNum);
        int __NFields;
};
#endif //__MPEG__MAPPER__H
```

What is claimed is:

1. A computer system for editing motion video compressed using interframe and intraframe techniques, including:

means for storing a compressed bitstream for each motion video source to be edited such that state information used to decode and display the compressed bitstream allows random access to and playback of each intraframe compressed image;

means for generating an index of the compressed bitstream that maps each temporal field of a corresponding decompressed output image sequence to a first compressed image used to start decompressing the temporal field, and an offset in the bitstream of the data for the first compressed image;

wherein the index has an entry for each temporal field of the corresponding decompressed output image sequence, and the entry includes an offset between the temporal field and a temporal field of the corresponding decompressed output image sequence corresponding to the first compressed image used to start decompressing the temporal field; and means for permitting a user to specify a composition of motion video segments, wherein each segment is defined by a range, specified in terms of temporal fields, at any temporal field within a motion video source;

means for identifying portions of the compressed bitstream to be used to generate each of the motion video segments using the range defining the segment and the field index; and a plurality of decoders for alternatingly processing the identified portions of the compressed bitstream for each of the motion video segments.

2. A computer implemented process for editing motion video compressed using interframe and intraframe techniques, including:

storing a compressed bitstream for each motion video source to be edited such that state information used to decode and display the compressed bitstream allows random access to and playback of each intraframe compressed image; wherein the index has an entry for each temporal field of the corresponding decompressed output image sequence, and the entry includes an offset between the temporal field and a temporal field of the corresponding decompressed output image sequence corresponding to the first compressed image used to start decompressing the temporal field; and generating an index of the compressed bitstream that maps each temporal field of a corresponding decompressed output image sequence to a first compressed image used to start decompressing the temporal field, and an offset in the bitstream of the data for the first compressed image;

permitting a user to specify a composition of motion video segments, wherein each segment is defined by a range, specified in terms of temporal fields, at any temporal field within a motion video source;

identifying portions of the compressed bitstream to be used to generate each of the motion video segments using the range defining the segment and the field index; and alternatingly processing the identified portions of the compressed bitstream for each of the motion video segments using a plurality of decoders.

3. The computer system of claim 1, wherein the index has an entry for each temporal field of the corresponding decompressed output image sequence, wherein the entry includes an offset between the temporal field and a temporal field of the corresponding decompressed output image sequence corresponding to the first compressed image used to start decompressing the temporal field.

4. The computer system of claim 1, further comprising means for copying and inserting into points within the compressed bitstream the state information used to decode and display the compressed image data.

5. The computer system of claim 1, wherein the state information includes at least one of a sequence header, sequence extension, sequence display extension, sequence scalable extension, quantization matrix extension and picture display extension.

6. The computer system of claim 1, further comprises means for compressing each video source to provide the compressed bitstream, including inserting header information containing the state information used to decode and display the compressed bitstream to allow random access to and playback of each intraframe compressed image.

7. The computer implemented process of claim 2, wherein the index has an entry for each temporal field of the corresponding decompressed output image sequence, wherein the entry includes an offset between the temporal field and a temporal field of the corresponding decompressed output image sequence corresponding to the first compressed image used to start decompressing the temporal field.

8. The computer implemented process of claim 2, further comprising copying and inserting into points within the compressed bitstream the state information used to decode and display the compressed image data.

9. The computer implemented process of claim 2, wherein the state information includes at least one of a sequence header, sequence extension, sequence display extension, sequence scalable extension, quantization matrix extension and picture display extension.

10. The computer implemented process of claim 2, further comprises compressing each video source to provide the compressed bitstream, including inserting header information containing the state information used to decode and display the compressed bitstream to allow random access to and playback of each intraframe compressed image.

* * * * *